US010474202B2

(12) United States Patent
Kitade

(10) Patent No.: US 10,474,202 B2
(45) Date of Patent: Nov. 12, 2019

(54) ELECTRONIC DEVICE

(71) Applicant: Rohm Co., Ltd., Kyoto (JP)

(72) Inventor: Tetsuya Kitade, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 38 days.

(21) Appl. No.: 15/628,409

(22) Filed: Jun. 20, 2017

(65) Prior Publication Data

US 2017/0373688 A1    Dec. 28, 2017

(30) Foreign Application Priority Data

Jun. 23, 2016  (JP) ................. 2016-124232

(51) Int. Cl.
*G06F 1/16* (2006.01)
*H03K 17/97* (2006.01)
*H04M 1/02* (2006.01)

(52) U.S. Cl.
CPC ............ *G06F 1/1677* (2013.01); *H03K 17/97* (2013.01); *H03K 2017/9713* (2013.01); *H04M 1/0245* (2013.01)

(58) Field of Classification Search
CPC ............ H03K 17/97; H03K 2017/9713; G06F 1/1677; H04M 1/0245
See application file for complete search history.

(56) References Cited

U.S. PATENT DOCUMENTS

| | | | | |
|---|---|---|---|---|
| 6,060,969 A  * | 5/2000 | Hufgard | ................ | H03K 17/97 324/207.21 |
| 9,857,835 B2 * | 1/2018 | Sun | ................ | G06F 1/1626 |
| 9,892,490 B2 * | 2/2018 | Honda | ................ | G06F 3/16 |
| 10,002,592 B2 * | 6/2018 | Cho | ................ | G06F 1/1677 |
| 2005/0124398 A1 * | 6/2005 | Lee | ................ | H04B 1/38 455/575.4 |
| 2006/0001512 A1 * | 1/2006 | Garcia | ................ | G01D 5/145 335/205 |
| 2009/0051174 A1 * | 2/2009 | Ho | ................ | E05C 1/10 292/251.5 |
| 2009/0051357 A1 * | 2/2009 | Sasaki | ................ | G01R 33/091 324/228 |

(Continued)

FOREIGN PATENT DOCUMENTS

| | | | |
|---|---|---|---|
| DE | 10304595 B3 * | 10/2004 | ............. G01D 5/145 |
| JP | 2012173260 A * | 9/2012 | ......... G01R 33/0029 |
| JP | 2015-119470 | 6/2015 | |

*Primary Examiner* — Mohamad A Musleh
(74) *Attorney, Agent, or Firm* — Fish & Richardson P.C.

(57) ABSTRACT

An electronic device includes: a first housing and a second housing provided to be capable of being displaced between a first state in which the first major surfaces thereof face each other and a second state in which the second major surfaces thereof face each other; a magnetic detection part provided in the first housing; a magnet provided in the second housing; and a control part configured to determine the first state and the second state based on an output of the magnetic detection part. The magnet is disposed such that a magnetization direction thereof is orthogonal to the first major surface and the second major surface of the second housing, and the magnetic detection part includes a first magnetic sensor and a second magnetic sensor arranged along a direction normal to the first major surface and the second major surface of the first housing.

21 Claims, 18 Drawing Sheets

(56) References Cited

U.S. PATENT DOCUMENTS

| | | | | |
|---|---|---|---|---|
| 2009/0278642 | A1* | 11/2009 | Fullerton | G01D 18/00 335/284 |
| 2011/0136552 | A1* | 6/2011 | Lee | H04M 1/0245 455/575.3 |
| 2012/0068942 | A1* | 3/2012 | Lauder | H01F 7/04 345/173 |
| 2013/0050557 | A1* | 2/2013 | Moriyasu | H04N 5/2251 348/333.06 |
| 2013/0076614 | A1* | 3/2013 | Ive | G06F 1/1677 345/156 |
| 2013/0328914 | A1* | 12/2013 | Smith | G06F 3/01 345/619 |
| 2013/0328917 | A1* | 12/2013 | Zambetti | G06F 1/1626 345/620 |
| 2015/0097558 | A1* | 4/2015 | Jin | H04B 1/3888 324/226 |
| 2015/0115943 | A1* | 4/2015 | Jin | H04M 1/0245 324/226 |
| 2017/0109488 | A1* | 4/2017 | Still | G16H 40/63 |
| 2017/0352459 | A1* | 12/2017 | Scales | H01F 7/021 |

* cited by examiner

ELECTRONIC DEVICE

CROSS-REFERENCE TO RELATED APPLICATION

This application is based upon and claims the benefit of priority from Japanese Patent Application No. 2016-124232, filed on Jun. 23, 2016, the entire contents of which are incorporated herein by reference.

TECHNICAL FIELD

The present disclosure relates to an electronic device such as a smartphone, a tablet, a laptop, or the like.

BACKGROUND

FIG. 16 is a schematic view showing a conventional example of an electronic device. The electronic device 200 of the conventional example includes a magnetic sensor IC 230 (for example, a bipolar detection Hall IC) built in a main body 210 and a magnet 240 built in a cover 220, both of which serve as a means for determining a first state (a left side in FIG. 16) in which the upper surface of the main body 210 is covered with the cover 220 and a second state (a right side in FIG. 16) in which the lower surface of the main body 210 is covered with the cover 220. The magnet 240 is disposed such that the magnetization direction thereof is parallel to the major surfaces of the cover 220.

The magnetic sensor IC 230 is disposed such that package major surfaces (i.e., upper surface and lower surface) thereof are parallel to the major surfaces of the main body 210, and is configured to detect the magnetic field (perpendicular magnetic field) perpendicularly applied the package major surfaces. According to FIG. 16, in the first state (the left side in FIG. 16), the magnetic sensor IC 230 detects a perpendicular magnetic field directed from the upper surface of the package to the lower surface of the package. On the other hand, in the second state (the right side in FIG. 16), the magnetic sensor IC 230 detects a perpendicular magnetic field directed from the lower surface of the package to the upper surface of the package. Accordingly, it is possible to distinguish between the first state (the left side in FIG. 16) and the second state (the right side in FIG. 16) based on whether the output polarity of the magnetic sensor IC 230 is positive or negative.

FIG. 17 is a schematic view for defining the displacement amounts (X, Y and Z) of the magnetic sensor IC 230 with respect to the magnet 240. As shown in FIG. 17, the displacement amount X in the left-right direction of the drawing sheet, the displacement amount Y in the front-back direction of the drawing sheet and the displacement amount Z in the up-down direction of the drawing sheet are respectively defined using the center of the lower surface of the magnet 240 as an origin O (0, 0 and 0). As for the positive and negative polarities of the displacement amounts (X, Y and Z), the rightward direction of the drawing sheet, the backward direction of the drawing sheet (a direction going into the sheet) and the downward direction of the drawing sheet are respectively set as positive directions.

FIG. 18 is a view showing the correlation between displacement amounts X and Z (displacement amount Y=0) of the magnetic sensor IC 230 and the perpendicular magnetic field. In FIG. 18, the horizontal axis represents the displacement amount X (mm) while the vertical axis represents the displacement amount Z (mm). In addition, as preconditions of FIG. 18, it is assumed that the magnet 240 is in the form of a thin plate having a length of 7.5 mm (in the left-right direction of the drawing sheet), a width of 7.5 mm (in the front-back direction of the drawing sheet), and a height of 0.5 mm (in the up-down direction of the drawing sheet). It is also assumed that the residual magnetic flux density of the magnet 240 is 1400 mT.

The gradation region in FIG. 18 is a region where the perpendicular magnetic field is 5 mT or more. In addition, it shows that the higher the gradation concentration, the larger the perpendicular magnetic field. In order to correctly distinguish the displacement states of the main body 210 and the cover 220 from the orientation of the perpendicular magnetic field detected by the magnetic sensor IC 230, it is necessary to position the magnetic sensor IC 230 and the magnet 240 so that in the first state or the second state described above, the magnetic sensor IC 230 is disposed within the gradation region shown in FIG. 18 (in the position shifted obliquely from the front face of the magnetic pole of the magnet 240).

However, in the electronic device 200 of the aforementioned conventional example, the magnetic field at the position obliquely shifted from the front face of the magnetic pole of the magnet 240 is only about one half of the magnetic field generated on the front surface of the magnetic pole at the maximum. Thus, even if the magnetic field is slightly shifted away from the magnet 240, the magnetic field is greatly attenuated.

For this reason, in the electronic device 200 of the conventional example described above, the detection distance of the magnetic sensor IC 230 (the distance at which the perpendicular magnetic field can be correctly detected) is short and the magnetic sensor IC 230 is vulnerable to noise. Thus, unintentional malfunction (erroneous state determination) may possibly occur due to the position shift of the cover 220.

Moreover, in the electronic device 200 of the conventional example described above, when the displacement amount X of the magnetic sensor IC 230 is changed from plus to minus, the direction of the perpendicular magnetic field applied to the magnetic sensor IC 230 is reversed. Thus, there is a possibility that the displacement states of the main body 210 and the cover 220 are erroneously detected.

In the related art, it is necessary to obliquely tilt the magnet provided in the cover obliquely with respect to the surface of the main body. This makes it very difficult to mount the magnet. Thus, there is a problem in that the thickness of the cover becomes large.

SUMMARY

The present disclosure provides some embodiments of an electronic device capable of correctly determining the displacement states of a first housing and a second housing with a simple configuration.

According to one embodiment of the present disclosure, there is provided an electronic device, including: a first housing and a second housing provided to be capable of being displaced between a first state in which first major surfaces thereof face each other and a second state in which second major surfaces thereof face each other; a magnetic detection part provided in the first housing; a magnet provided in the second housing; and a control part configured to determine the first state and the second state based on an output of the magnetic detection part, wherein the magnet is disposed such that a magnetization direction thereof is orthogonal to the first major surface and the second major surface of the second housing, and wherein the magnetic detection part includes a first magnetic sensor and a second magnetic sensor arranged along a direction normal to the first major surface and the second major surface of the first housing (first configuration).

In the device of the first configuration described above, the control part may be configured to determine the first state and the second state by comparing outputs of the first magnetic sensor and the second magnetic sensor (second configuration).

In the device of the first configuration described above, the first magnetic sensor and the second magnetic sensor may be integrated in a single magnetic sensor IC (third configuration).

In the device of the first configuration or the second configuration described above, the first magnetic sensor may be integrated in a first magnetic sensor IC, the second magnetic sensor may be integrated in a second magnetic sensor IC, the first magnetic sensor IC may be mounted on a first mounting surface of a printed circuit board, and the second magnetic sensor IC may be mounted on a second mounting surface of the printed circuit board (fourth configuration).

In the device of the first configuration described above, the magnetic detection part may further include a third magnetic sensor and a fourth magnetic sensor arranged along a direction normal to the first major surface and the second major surface of the first housing, the third magnetic sensor may be disposed on the same plane as the first magnetic sensor, and the fourth magnetic sensor may be disposed on the same plane as the second magnetic sensor (fifth configuration).

In the device of the fifth configuration described above, the control part may be configured to determine the first state and the second state by determining whether a differential output between the first magnetic sensor and the fourth magnetic sensor or a differential output between the second magnetic sensor and the third magnetic sensor, whichever has a larger absolute value, is positive or negative (sixth embodiment).

In the device of the fifth configuration or the sixth configuration described above, the first magnetic sensor, the second magnetic sensor, the third magnetic sensor and the fourth magnetic sensor may be integrated in a single magnetic sensor IC (seventh configuration).

In the device of the fifth configuration or the sixth configuration described above, the first magnetic sensor and the second magnetic sensor may be integrated in a first magnetic sensor IC, the third magnetic sensor and the fourth magnetic sensor may be integrated in a second magnetic sensor IC, and the first magnetic sensor IC and the second magnetic sensor IC may be mounted on the same mounting surface of a printed circuit board (eighth configuration).

The device of any one of the first to eighth configurations described above may further include: a display part provided on the first major surface of the first housing; and an operation part provided on the first major surface of the second housing, wherein the control part is configured to put the electronic device in a pause state when the first state is determined and to put the operation part in an invalid state when the second state is determined (ninth configuration).

In the device of any one of the first to ninth configurations described above, the first housing and the second housing may be detachably attached to each other (tenth configuration).

DETAILED DESCRIPTION

Figure 1:
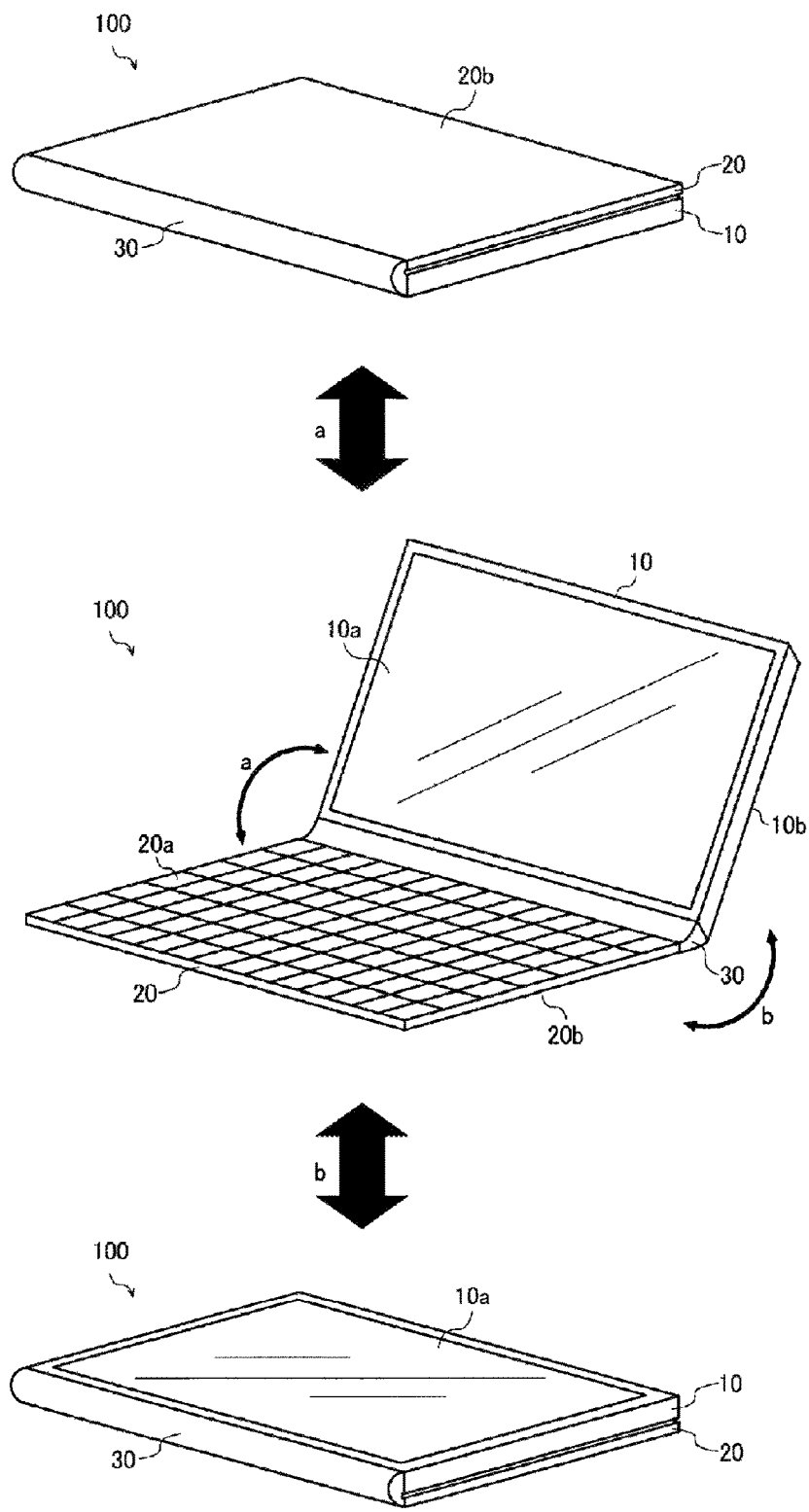
FIG. 1 is an external view of an electronic device.

Embodiments of the present disclosure will now be described in detail with reference to the drawings.
<Electronic Device>
FIG. 1 is an external view of an electronic device. The electronic device 100 of the present configuration example is a hybrid type mobile terminal (so-called 2-in-1 PC) that can be used as a notebook PC or a tablet. The electronic device 100 includes a main body 10, a cover 20, and a connecting portion 30.

The main body 10 corresponds to a first housing of the electronic device 100 and includes a first major surface 10a and a second major surface 10b. A display part (a liquid crystal display, an organic EL display or the like) having a touch panel function is provided on the first major surface 10a.

The cover 20 corresponds to a second housing of the electronic device 100 and includes a first major surface 20a and a second major surface 20b. An operation part (a keyboard or the like) for accepting a user operation is provided on the first major surface 20a.

As indicated by arrows a and b in FIG. 1, the connecting portion 30 supports the cover 20 so as to be rotatable (openable and closable) by about 360 degrees with respect to the main body 10 using itself as a rotating shaft (opening/closing shaft). In the example of FIG. 1, the connecting portion 30 is depicted as a hinge member independent from the main body 10 and the cover 20. However, the configuration of the connecting portion 30 is not limited thereto. The connecting portion 30 may be provided as a part of the cover 20. Further, the main body 10 and the cover 20 may be detachable.

<Displacement State>

The main body 10 and the cover 20 may take, as a displacement state thereof, one of a first state (an upper stage in FIG. 1) in which the electronic device 100 is used as a notebook PC, a second state (a lower stage in FIG. 1) in which the electronic device 100 is used as a tablet, and a third state (a middle stage in FIG. 1) in which the electronic device 100 is used as a notebook PC.

The first state (the upper stage in FIG. 1) indicates a state in which the cover 20 is closed so as to cover the front face (the first major surface 10a) of the main body 10. In the first state, the main body 10 and the cover 20 are parallel to each other so that the respective first major surfaces 10a and 20a face each other.

The second state (the lower stage in FIG. 1) indicates a state in which the cover 20 is folded on the side of the back surface (the second major surface 10b) of the main body 10. In the second state, the main body 10 and the cover 20 are parallel to each other so that the respective second major surfaces 10b and 20b face each other.

As used herein, the term "face" may be understood to encompass not only a state in which no intervening object exists between the facing major surfaces, but also a state in which a liquid crystal protection film, a keyboard cover or the like is interposed between the facing major surfaces.

Additionally, the distance between the facing major surfaces is shorter than the distance between the non-facing major surfaces. More specifically, in the first state in which the first major surfaces 10a and 20a face each other, the distance between the first major surfaces is shorter than the distance between the second major surfaces. Conversely, in the second state in which the second major surfaces 10b and 20b face each other, the distance between the second major surfaces is shorter than the distance between the first major surfaces.

The third state (the middle stage in FIG. 1) indicates a state in which the cover 20 is opened and fixed at an arbitrary angle. That is, the third state may be understood to be a state available during the transition from one of the first state and the second state to the other.

The electronic device 100 of the present configuration example includes a magnetic sensor and a magnet, as a way to determine the displacement states described above. In particular, the electronic device 100 is characterized by the arrangement of the magnetic sensor and the magnet, and the calculation method of a sensor output. Therefore, in the following description, a novel configuration for correctly determining the displacement states of the main body 10 and the cover 20 is proposed while taking specific embodiments as examples.

<First Embodiment>

Figure 2:
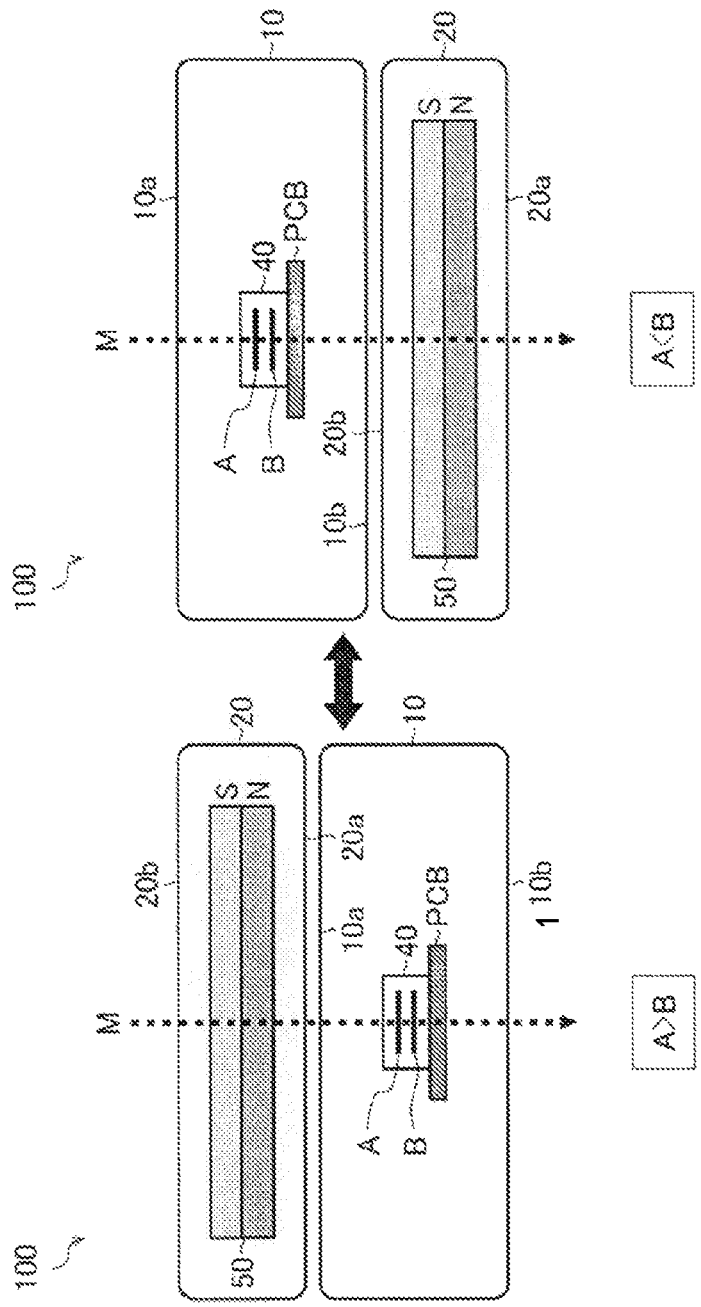
FIG. 2 is a schematic view showing a first embodiment of an electronic device.

FIG. 2 is a schematic view showing a first embodiment of the electronic device 100. On the left side of FIG. 2, there is shown the first state (corresponding to the upper stage in FIG. 1) in which the first major surfaces 10a and 20a of the main body 10 and the cover 20 face each other. On the right side of FIG. 2, there is shown the second state (corresponding to the lower stage in FIG. 1) in which the second major surfaces 10b and 20b of the main body 10 and the cover 20 face each other.

As shown in FIG. 2, the electronic device 100 of the present embodiment includes a magnetic sensor IC 40 (corresponding to a magnetic detection part) and a magnet 50 which are disposed inside the main body 10 and the cover 20, respectively.

The magnetic sensor IC 40 is a semiconductor integrated circuit device in which two magnetic sensors A and B are integrated. The magnetic sensor IC 40 is mounted on a mounting surface of a printed circuit board PCB so that the package major surfaces (upper surface and lower surface) thereof is parallel to the first major surface 10a and the second major surface 10b of the main body 10.

The magnetic sensors A and B are arranged in the illustrated order (the first major surface 10a—the magnetic sensor A—the magnetic sensor B—the second major surface 10b) along the direction normal to the package major surfaces of the magnetic sensor IC 40, ultimately the direction normal to the first major surface 10a and the second major surface 10b of the main body 10. Each of the magnetic sensors A and B detects a magnetic field (perpendicular magnetic field) applied perpendicularly to the package major surfaces of the magnetic sensor IC 40. As magnetic sensors A and B, it may be possible to suitably use Hall elements, magneto-resistive elements, or the like.

The magnet 50 is disposed so that the magnetization direction thereof is orthogonal to the first major surface 20a and the second major surface 20b of the cover 20. According to FIG. 2, the magnet 50 is arranged such that the N pole faces the first major surface 20a and the S pole faces the second major surface 20b. Accordingly, in the first state (the left side in FIG. 2) or in the second state (the right side in FIG. 2), the magnetic sensor IC 40 is applied with a magnetic field directed from the package upper surface to the package lower surface thereof.

Although not explicitly shown in FIG. 2, on the printed circuit board PCB of the main body 10, there is mounted a microcomputer (corresponding to a control part) (see FIG. 5 below) 60 for determining a first state (a left side in FIG. 2) and a second state (a right side in FIG. 2) on the basis of an output of the magnetic sensor IC 40.

As shown in FIG. 2, the distance between the magnetic sensor A and the magnet 50 is shorter than the distance between the magnetic sensor B and the magnet 50 in the first state (the left side in FIG. 2). Thus, the perpendicular magnetic field applied to the magnetic sensor A becomes larger than the perpendicular magnetic field applied to the magnetic sensor B. Therefore, when comparing the outputs of the magnetic sensors A and B, A>B (or A−B>0).

On the other hand, in the second state (the right side in FIG. 2), the distance between the magnetic sensor B and the magnet 50 is shorter than the distance between the magnetic sensor A and the magnet 50. Thus, the perpendicular magnetic field applied to the magnetic sensor B becomes larger than the perpendicular magnetic field applied to the magnetic sensor A. Therefore, when comparing the outputs of the magnetic sensors A and B, A<B (or A−B<0).

From the foregoing, the microcomputer 60 compares the outputs of the magnetic sensors A and B to determine between the first state (the left side in FIG. 2) and the second state (the right side in FIG. 2). According to FIG. 2, the microcomputer 60 determines the displacement state to be the first state (the left side in FIG. 2) when A>B (or A−B>0), and determines the displacement state to be the second state (the right side in FIG. 2) when A<B (or A−B<0).

Although not explicitly shown in FIG. 2, the main body 10 and the cover 20 are separated from each other in the third state (the middle stage in FIG. 1). Thus, no magnetic field is applied to the magnetic sensor IC 40. Therefore, when the outputs of the magnetic sensors A and B are lower than a threshold value or when the sum total of the outputs of the magnetic sensors A and B is lower than a threshold value, the microcomputer 60 may determine the displacement state to be the third state (the middle stage in FIG. 1).

As described above, the first state (the left side in FIG. 2) is a displacement state in which the electronic device 100 is not used (see also the upper stage of FIG. 1). In view of this, it is preferable that the microcomputer 60 puts the electronic device 100 (at least the display part) in a pause state when it is determined that the displacement state is the first state (the left side in FIG. 2). By executing such control, it is possible to suppress power consumption in the electronic device 100. This makes it possible to extend the battery driving time.

Furthermore, as described above, the second state (the right side in FIG. 2) is a displacement state in which the electronic device 100 is used as a tablet (see also the lower stage of FIG. 1). In view of this, it is preferable that the microcomputer 60 puts the operation part of the cover 20 in an invalid state when it is determined that the displacement state is the second state (the right side in FIG. 2). By executing such control, even if a user accidentally touches the operation part during the use of the electronic device as a tablet, an unintended erroneous operation does not occur.

Figure 3:
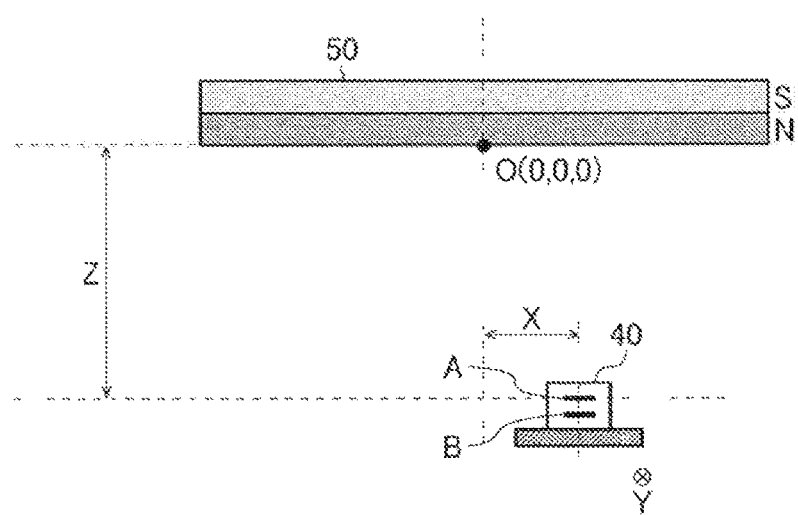
FIG. 3 is a schematic view for defining a displacement amount of a magnetic sensor IC with respect to a magnet.

FIG. 3 is a schematic view for defining displacement amounts (X, Y, and Z) of the magnetic sensor IC 40 (especially, the magnetic sensor A) with respect to the magnet 50 in the electronic device 100 of the first embodiment. As shown in FIG. 3, the displacement amount X in the left-right direction of the drawing sheet, the displacement amount Y in the front-back direction of the drawing sheet and the displacement amount Z in the up-down direction of the drawing sheet are respectively defined using the center of the lower surface of the magnet 50 as an origin O (0, 0, and 0). As for the positive and negative polarities of the displacement amounts (X, Y, and Z), the rightward direction of the drawing sheet, the backward direction of the drawing sheet and the downward direction of the drawing sheet are respectively set as positive directions.

Figure 4:
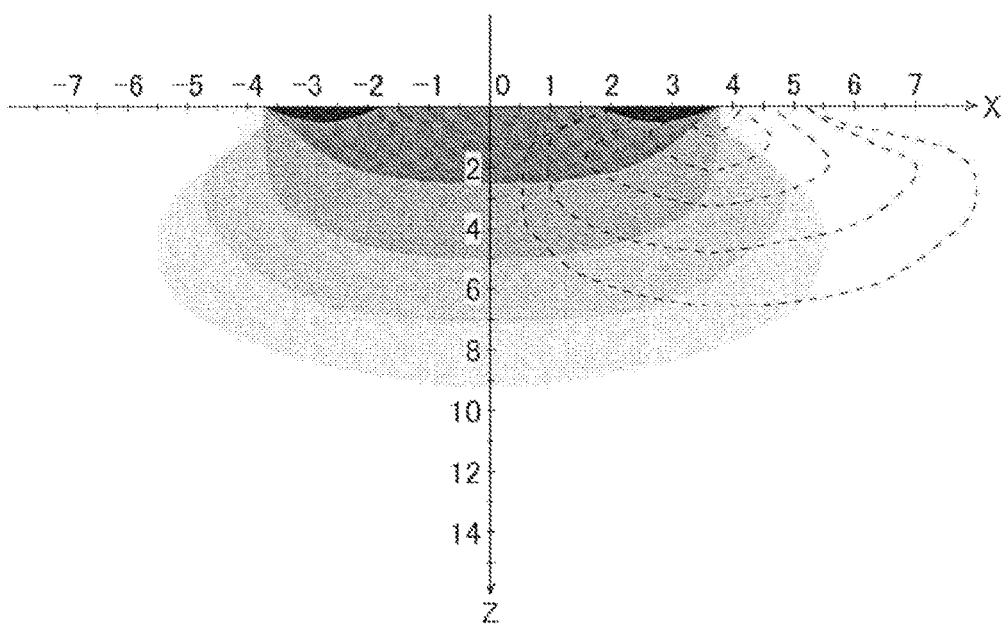
FIG. 4 is a view showing a correlation between a displacement amount of a magnetic sensor IC and a perpendicular magnetic field.
Figure 16:
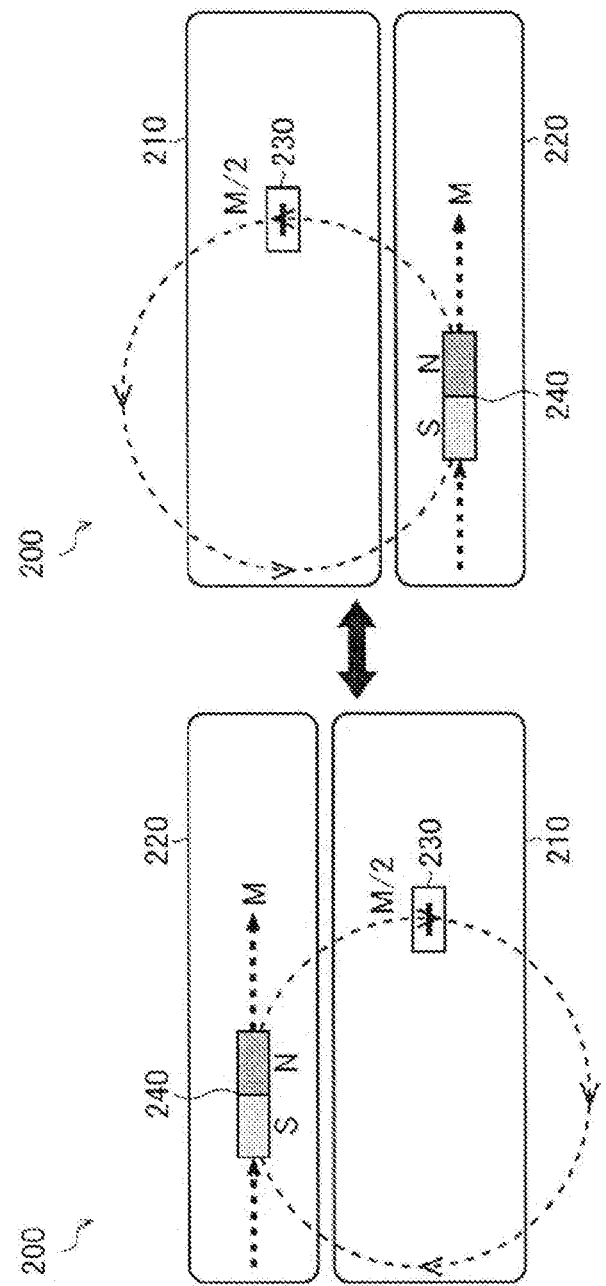
FIG. 16 is a schematic view showing a conventional example of an electronic device.
Figure 17:
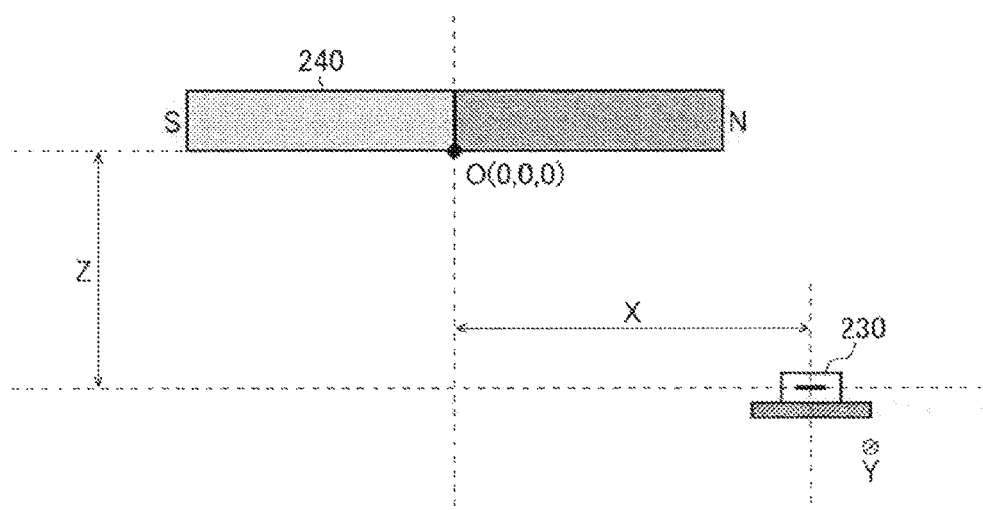
FIG. 17 is a schematic view for defining a displacement amount of a magnetic sensor IC with respect to a magnet.

FIG. 4 is a view showing the correlation between displacement amounts X and Z (displacement amount Y=0) of the magnetic sensor IC 40 and the perpendicular magnetic field. In FIG. 4, the horizontal axis represents the displacement amount X (mm) and the vertical axis represents the displacement amount Z (mm). In addition, as preconditions of FIG. 4, it is assumed that the magnet 50 is in the form of a thin plate having a length of 7.5 mm (in the left-right direction of the drawing sheet), a width of 7.5 mm (in the front-back direction of the drawing sheet) and a height of 0.5 mm (in the up-down direction of the drawing sheet). It is also assumed that the residual magnetic flux density of the magnet 50 is 1400 mT. That is, the magnet 50 is the same as the magnet 240 of the conventional example (see FIG. 16) except the difference in the magnetization direction.

Figure 18:
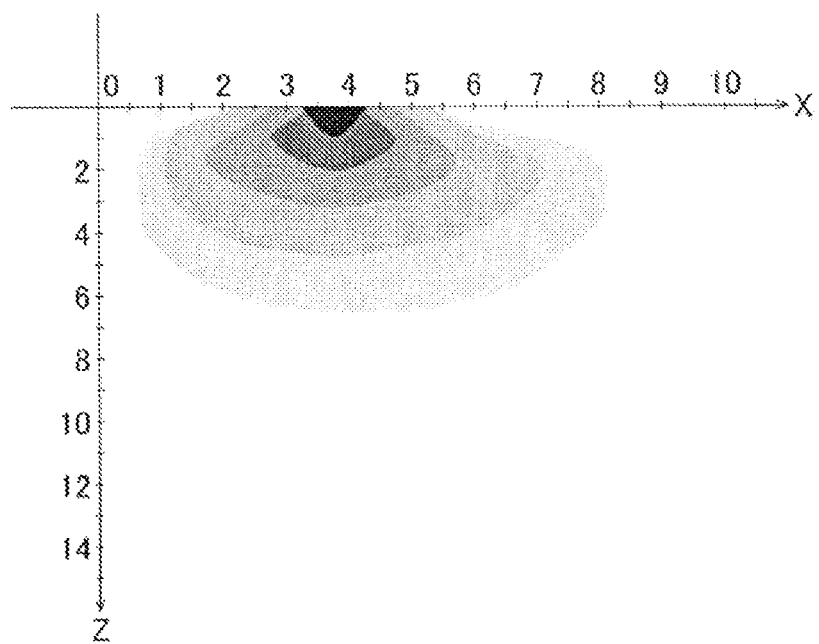
FIG. 18 is a view showing a correlation between a displacement amount of a magnetic sensor IC and a perpendicular magnetic field.

In addition, the gradation region in FIG. 4 is a region where the perpendicular magnetic field is 5 mT or more. The higher the gradation concentration, the larger the perpendicular magnetic field. On the other hand, the broken line region in FIG. 4 shows the correlation view of the conventional example (see FIG. 18) in a superimposed manner for the sake of comparison and reference.

In order to correctly determine the displacement states of the main body 10 and the cover 20 by comparing the outputs of the magnetic sensors A and B, it is desirable to position the magnetic sensor IC 40 and the magnet 50 so that, in the first state or the second state described above, the magnetic sensor IC 40 is disposed within the gradation region in FIG. 4 (on the front side of the magnetic pole of the magnet 50).

The magnetic field on the front side of the magnetic pole is larger than the magnetic field in other positions and is difficult to attenuate even if it is somewhat away from the magnet 50. Therefore, according to the electronic device 100 of the present embodiment, the detection range of the magnetic sensor IC 40 is wider and more resistant to noise as compared with the conventional example. It is therefore possible to reduce an erroneous operation (erroneous state determination) caused by a positional deviation of the cover 20 or the like.

Since the direction of the perpendicular magnetic field applied to the magnetic sensor IC 40 is not reversed even if the displacement amount X of the magnetic sensor IC 40 is changed from plus to minus due to the positional deviation of the cover 20 or the like, there is no possibility that the displacement state of the main body 10 and the cover 20 is erroneously detected.

<Magnetic Sensor IC>

Figure 5:
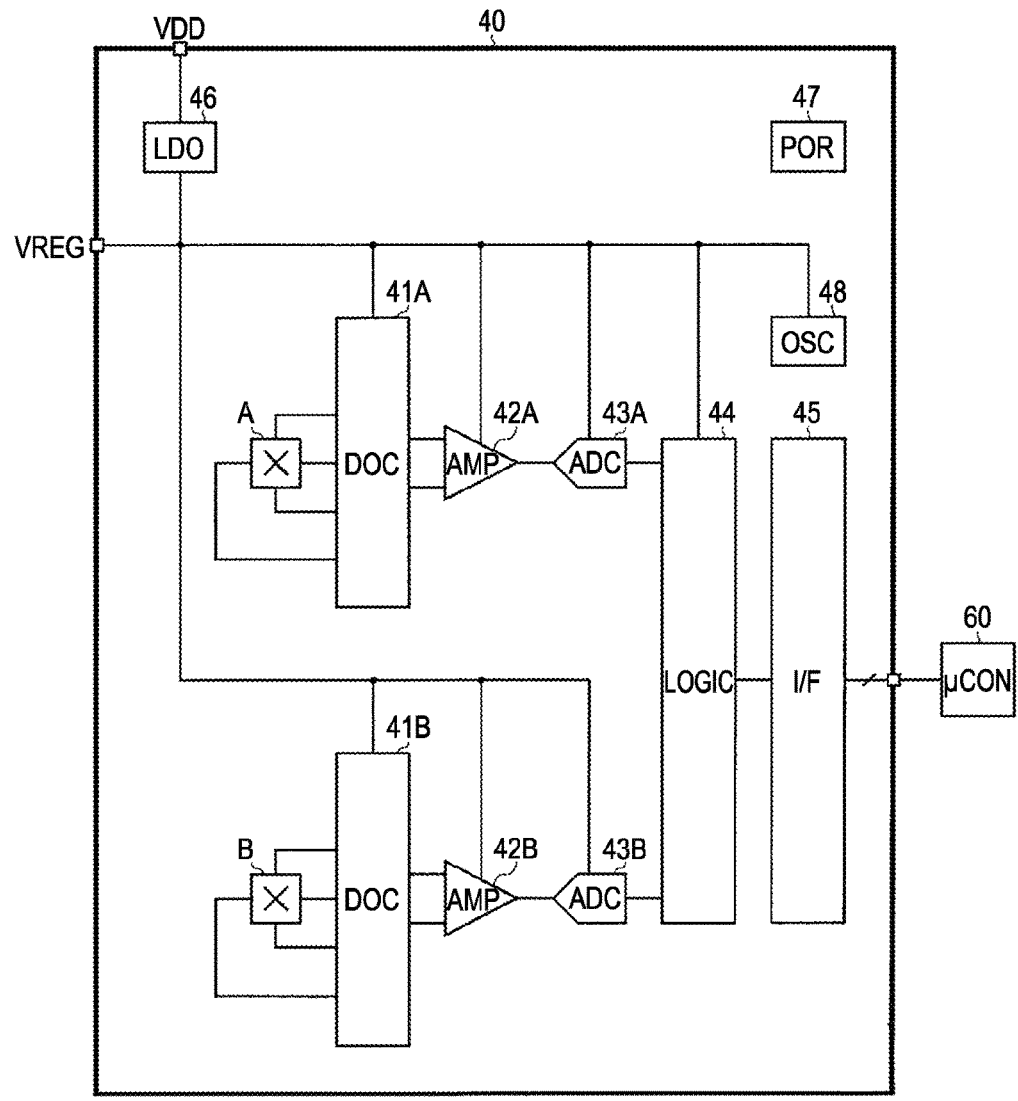
FIG. 5 is a block diagram showing a configuration example of a magnetic sensor IC.

FIG. 5 is a block diagram showing a configuration example of the magnetic sensor IC 40. The magnetic sensor IC 40 of the present configuration example is formed by integrating, in addition to the magnetic sensors A and B, dynamic offset cancellers 41A and 41B (hereinafter referred to as DOCs 41A and 41B), amplifiers 42A and 42B, AD (analog-to-digital] converters 43A and 43B, a logic part 44, an interface part 45, a regulator 46, a power-on reset part 47, and an oscillator 48.

The magnetic sensors A and B are respectively configured to detect a magnetic field (perpendicular magnetic field) applied perpendicularly to the package major surfaces of the magnetic sensor IC 40. Each of the magnetic sensors A and B using Hall elements or magneto-resistance elements may be equivalently represented by a Wheatstone bridge circuit (resistor bridge circuit).

Each of the DOCs 41A and 41B is operated by receiving the supply of an internal power supply voltage VREG By switching the direction of the drive current of the magnetic sensors A and B, each of the DOCs 41A and 41B cancels the offset voltages of the magnetic sensors A and B, thereby sampling, holding and outputting only a desired signal component.

Each of the amplifiers 42A and 42B is operated by receiving the internal power supply voltage VREG and is configured to amplify the sampling/holding outputs of the DOCs 41A and 41B with a predetermined gain.

Each of the AD converters 43A and 43B is operated by receiving the supply of the internal power supply voltage VREG and is configured to convert an analog amplifier output into a digital signal.

The logic part 44 is operated by receiving the supply of the internal power supply voltage VREG and is configured to output the digital signal inputted from the AD converters 43A and 43B to the microcomputer 60 via the interface part 45. The microcomputer 60 determines the first state and the second state by comparing the outputs of the magnetic sensors A and B.

The interface part 45 includes an I²C bus or an SPI (serial peripheral interface) bus (or both) and performs bidirectional communication between the logic part 44 and the microcomputer 60.

The regulator 46 converts an external power supply voltage VDD to a predetermined internal power supply voltage VREG As the regulator 46, an LDO (low drop-out) regulator having a small circuit scale or the like may be suitably used.

The power-on reset part 47 monitors the external power supply voltage VDD or the internal power supply voltage VREG and performs a power-on reset process for each part of the IC.

The oscillator 48 is operated by receiving the supply of the internal power supply voltage VREG, and is configured to generate a drive clock signal necessary for the operation of each part of the IC.

<Second Embodiment>

Figure 6:
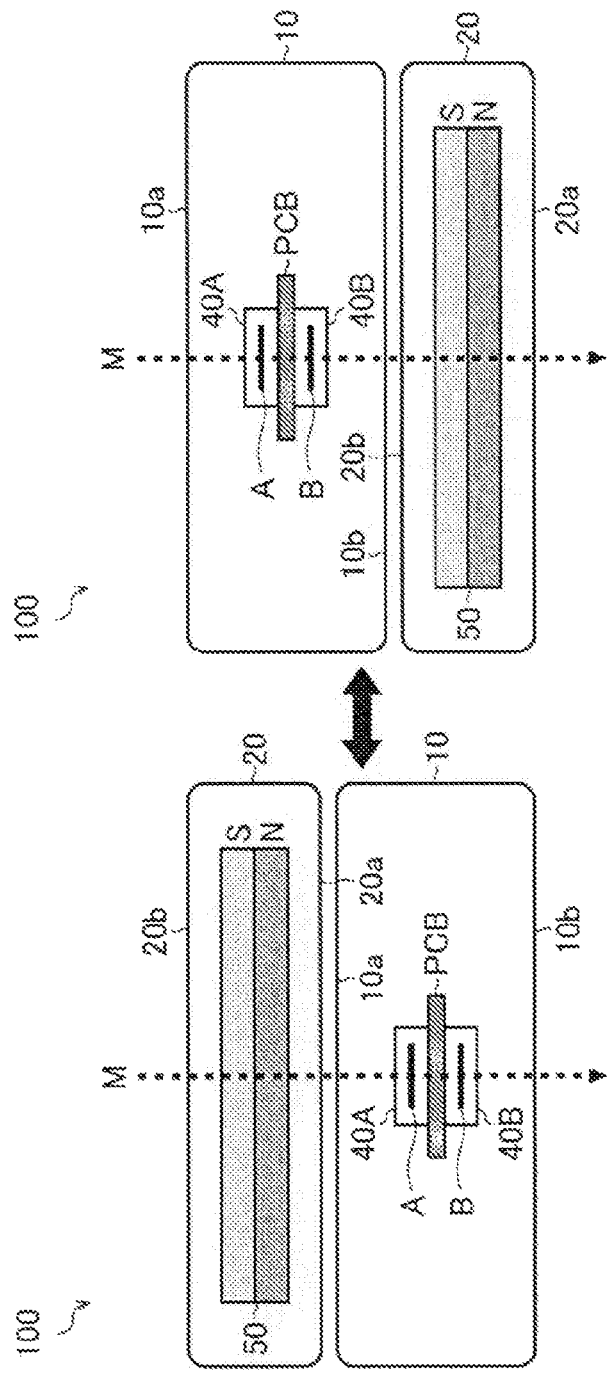
FIG. 6 is a schematic view showing a second embodiment of an electronic device.

FIG. 6 is a schematic view showing a second embodiment of the electronic device 100. The present embodiment is based on the first embodiment (see FIG. 2) described above and is characterized in that the magnetic sensors A and B are dispersed and integrated in different magnetic sensor ICs 40A and 40B. Therefore, the same constituent elements as those of the first embodiment are designated by the same reference numerals as in FIG. 2. Duplicate description thereof will be omitted. Hereinafter, elements of the second embodiment will be mainly described.

As shown in FIG. 6, the magnetic sensor IC 40A in which the magnetic sensor A is integrated is mounted on a first mounting surface of the printed circuit board PCB. On the other hand, the magnetic sensor IC 40B in which the magnetic sensor B is integrated is mounted on a second mounting surface of the printed circuit board PCB.

The magnetic sensor ICs 40A and 40B are mounted in the overlapping positions on the front and back sides of the printed circuit board PCB to sandwich the printed circuit board PCB such that the integrated magnetic sensors A and B are arranged along the direction normal to the first major surface 10a and the second major surface 10b of the main body 10.

By adopting such a configuration, it is possible to widen the distance between the sensors (the distance between the magnetic sensor A and the magnetic sensor B) as compared with the first embodiment (see FIG. 2) described above. Therefore, the output difference between the magnetic sensors A and B becomes large. Thus, even if the positional deviation of the cover 20 occurs, it is possible to correctly determine the displacement states of the main body 10 and the cover 20.

<Third Embodiment>

Figure 7:
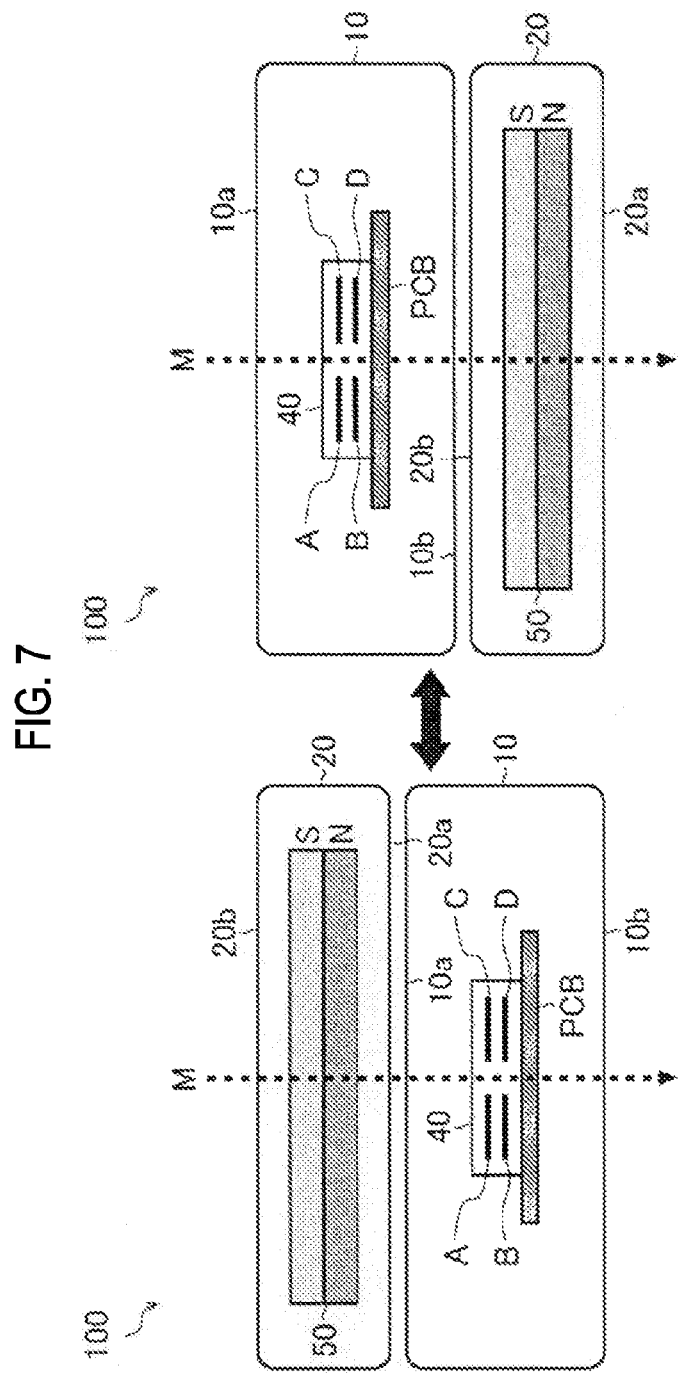
FIG. 7 is a schematic view showing a third embodiment of an electronic device.

FIG. 7 is a schematic view showing a third embodiment of the electronic device 100. The present embodiment is based on the first embodiment (see FIG. 2) described above and is characterized in that in addition to the magnetic sensors A and B described above, the magnetic sensors C and D are further integrated in a single magnetic sensor IC 40. Therefore, the same constituent elements as those of the first embodiment are designated by the same reference numerals as in FIG. 2. Duplicate description thereof will be omitted. Hereinafter, the characterizing parts of the third embodiment will be mainly described.

Similar to the magnetic sensors A and B described above, the magnetic sensors C and D are arranged in the illustrated order (the first major surface 10a—the magnetic sensor C—the magnetic sensor D—the second major surface 10b) along the direction normal to the package major surfaces of the magnetic sensor IC 40, ultimately the direction normal to the first major surface 10a and the second major surface 10b of the main body 10. Each of the magnetic sensors C and D detects a magnetic field (perpendicular magnetic field) applied perpendicularly to the package major surfaces of the magnetic sensor IC 40. The magnetic sensor C is disposed on the same plane as the magnetic sensor A, and the magnetic sensor D is arranged on the same plane as the magnetic sensor B.

In this way, when using the magnetic sensor IC 40 in which the four magnetic sensors A to D are integrated, the comparison of outputs are performed with respect to the magnetic sensors A and D (or B and C) arranged in the diagonal direction rather than the magnetic sensors A and B (or C and D) arranged in the vertical direction. This makes it possible to correctly determine the displacement states of the main body 10 and the cover 20. Hereinafter, the reasons will be explained while giving a concrete calculation example.

Figure 8:
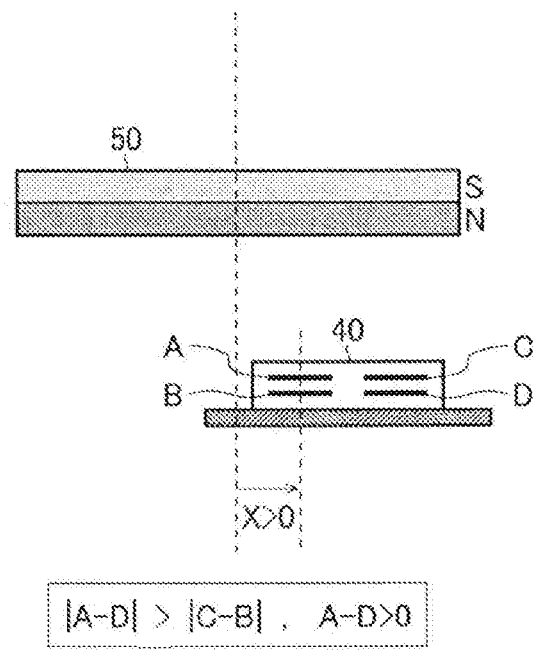
FIG. 8 is a schematic view showing an output state in a first state (X>0).

FIG. 8 is a schematic view showing an output state when the displacement amount X of the magnetic sensor IC 40 with respect to the magnet 50 is positive (X>0) in the above-described first state (the left side in FIG. 7). In the following description, it is assumed that the outputs of the respective magnetic sensors A to D are such that A=19.86 mT, B=18.40 mT, C=18.86 mT, and D=17.48 mT.

In this case, A−D=+2.38 mT (=19.86 mT−17.48 mT) and C−B=+0.46 mT (=18.86 mT−18.40 mT). Thus, |A−D|>|C−B|. Accordingly, the microcomputer 60 determines the first state and the second state by determining the positive/negative of the one having a larger absolute value (in this case, A−D). In the example of FIG. 8, since A−D>0, it is determined that the displacement state is the state in which the magnet 50 is located on the upper surface side of the magnetic sensor IC 40, namely the first state (the left side in FIG. 7).

The differential output (=A−D=+2.38 mT) between the magnetic sensors A and D is larger than the differential output (=A−B=+1.46 mT) between the magnetic sensors A and B, and is larger than the differential output (=C−D=+1.38 mT) between the magnetic sensors C and D. In view of this, it can be said that when determining the displacement states of the main body 10 and the cover 20, it is more advantageous to compare the outputs of the magnetic sensors A and D (or B and C) provided in the diagonal positions than to compare the outputs of the magnetic sensors A and B (or C and D) arranged in the vertical direction.

Figure 9:
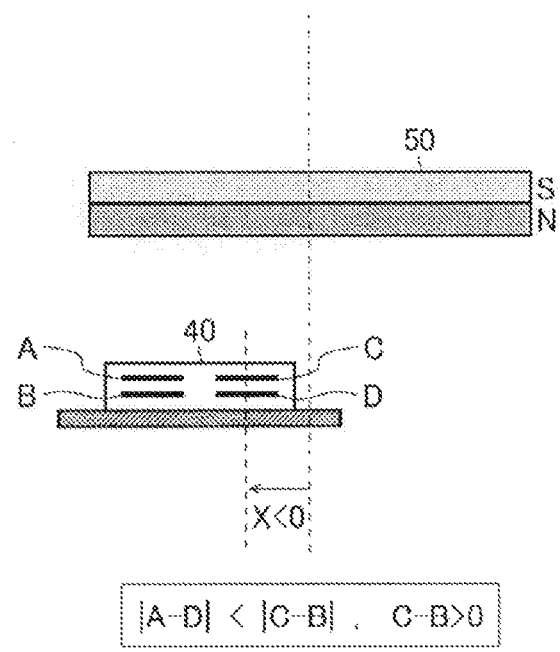
FIG. 9 is a schematic view showing an output state in a first state (X<0).

FIG. 9 is a schematic view showing an output state when X<0 in the above-described first state (the left side in FIG. 7). In the following description, it is assumed that A=18.86 mT, B=17.48 mT, C=19.86 mT, and D=18.40 mT.

In this case, A−D=+0.46 mT (=18.86 mT−18.40 mT) and C−B=+2.38 mT (=19.86 mT−17.48 mT). Thus, |A−D|<|C−B|. Accordingly, the microcomputer 60 determines the first state and the second state by determining the positive/negative of the one having a larger absolute value (in this case, C−B). In the example of FIG. 9, since C−B>0, it is determined that the displacement state is the first state (the left side in FIG. 7).

Figure 10:
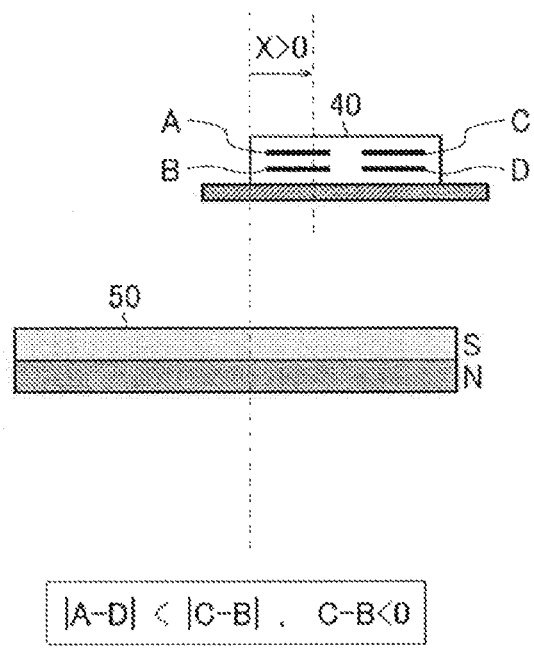
FIG. 10 is a schematic view showing an output state in a second state (X>0).

FIG. 10 is a schematic view showing an output state when X>0 in the above-described second state (the right side in FIG. 7). In the following description, it is assumed that A=18.40 mT, B=19.86 mT, C=17.48 mT, and D=18.86 mT.

In this case, A−D=−0.46 mT (=18.40 mT−18.86 mT) and C−B=−2.38 mT (=17.48 mT−19.86 mT). Thus, |A−D|<|C−B|. Accordingly, the microcomputer 60 determines the first state and the second state by determining the positive/negative of the one having a larger absolute value (in this case, C−B). In the example of FIG. 10, since C−B<0, it is determined that the displacement state is the state in which the magnet 50 is located on the lower surface side of the magnetic sensor IC 40, namely the second state (the right side in FIG. 7).

Figure 11:
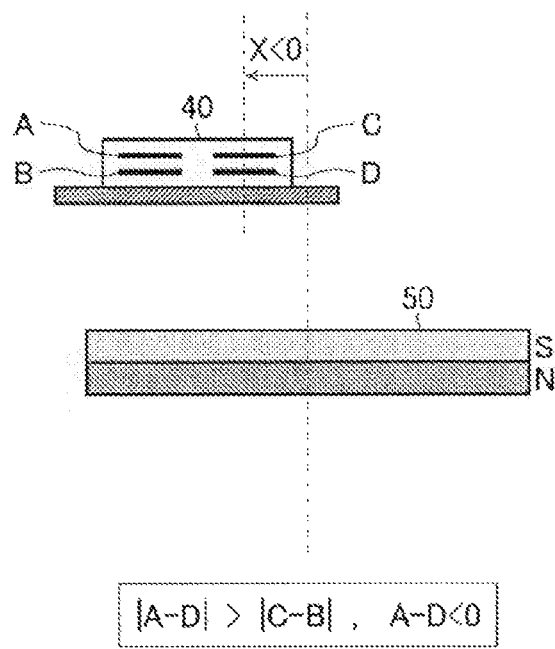
FIG. 11 is a schematic view showing an output state in a second state (X<0).

FIG. 11 is a schematic view showing an output state when X<0 in the above-described second state (the right side in FIG. 7). In the following description, it is assumed that A=17.48 mT, B=18.86 mT, C=8.40 mT, and D=9.86 mT.

In this case, A−D=−2.38 mT (=17.48 mT−19.86 mT) and C−B=−0.46 mT (=18.40 mT−18.86 mT). Thus, |A−D|>|C−B|. Accordingly, the microcomputer 60 determines the first state and the second state by determining the positive/negative of the one having a larger absolute value (in this case, A−D). In the example of FIG. 11, since A−D<0, it is determined that the displacement state is the second state (the right side in FIG. 7).

As described above and as shown in FIGS. 8 to 11, the microcomputer 60 determines the first state and the second state by determining the positive/negative of the differential output (=A−D) between the magnetic sensors A and D or the differential output (=C−B) between the magnetic sensors B and C, whichever has a larger absolute value. With such a configuration, as compared with the first embodiment (see FIG. 2), it is possible to more correctly determine the displacement states of the main body 10 and the cover 20.

Although not explicitly shown in FIGS. 8 to 11, when the outputs of the magnetic sensors A to D are smaller than a threshold value or when the sum total of the outputs of the magnetic sensors A to D is smaller than a threshold value, it can be determined that the displacement state is the third state (the middle stage in FIG. 1) described above.

Figure 12:
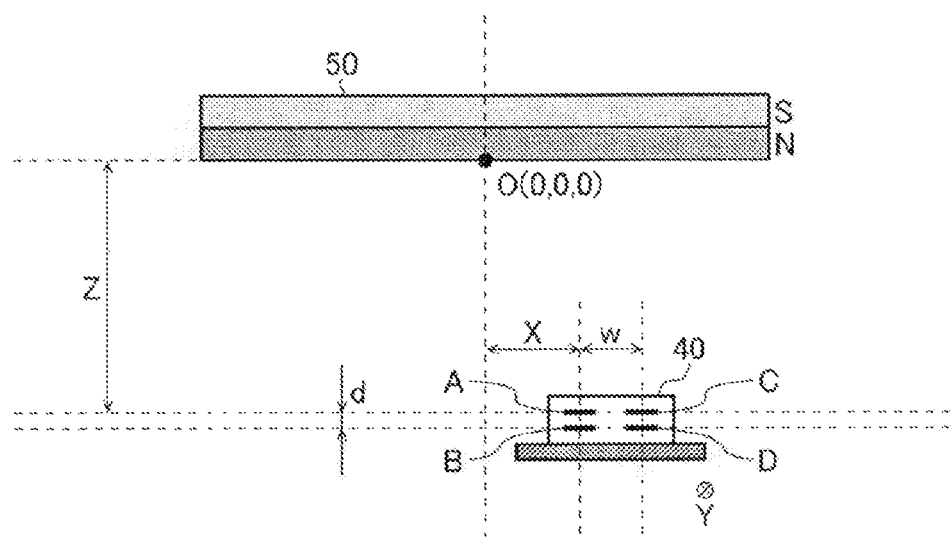
FIG. 12 is a schematic view for defining a displacement amount of a magnetic sensor IC with respect to a magnet.

FIG. 12 is a schematic view for defining the displacement amounts (X, Y and Z) of the magnetic sensor IC 40 (especially, the magnetic sensor A) with respect to the magnet 50 in the electronic device 100 of a third embodiment. As shown in FIG. 12, the displacement amount X in the left-right direction of the drawing sheet, the displacement amount Y in the front-back direction of the drawing sheet and the displacement amount Z in the up-down direction of the drawing sheet are respectively defined using the center of the lower surface of the magnet 50 as an origin O (0, 0 and 0). As for the positive and negative polarities of the displacement amounts (X, Y and Z), the rightward direction of the drawing sheet, the backward direction of the drawing sheet and the downward direction of the drawing sheet are respectively set as positive directions.

It is assumed that the magnetic sensors A and B (or C and D) are formed so as to be spaced apart from each other by a predetermined inter-sensor distance d in the up-down direction of the drawing sheet, and the magnetic sensors A and C (or B and D) are formed so as to be spaced apart from each other by a predetermined inter-sensor distance w in the left-right direction of the drawing sheet.

Figure 13:
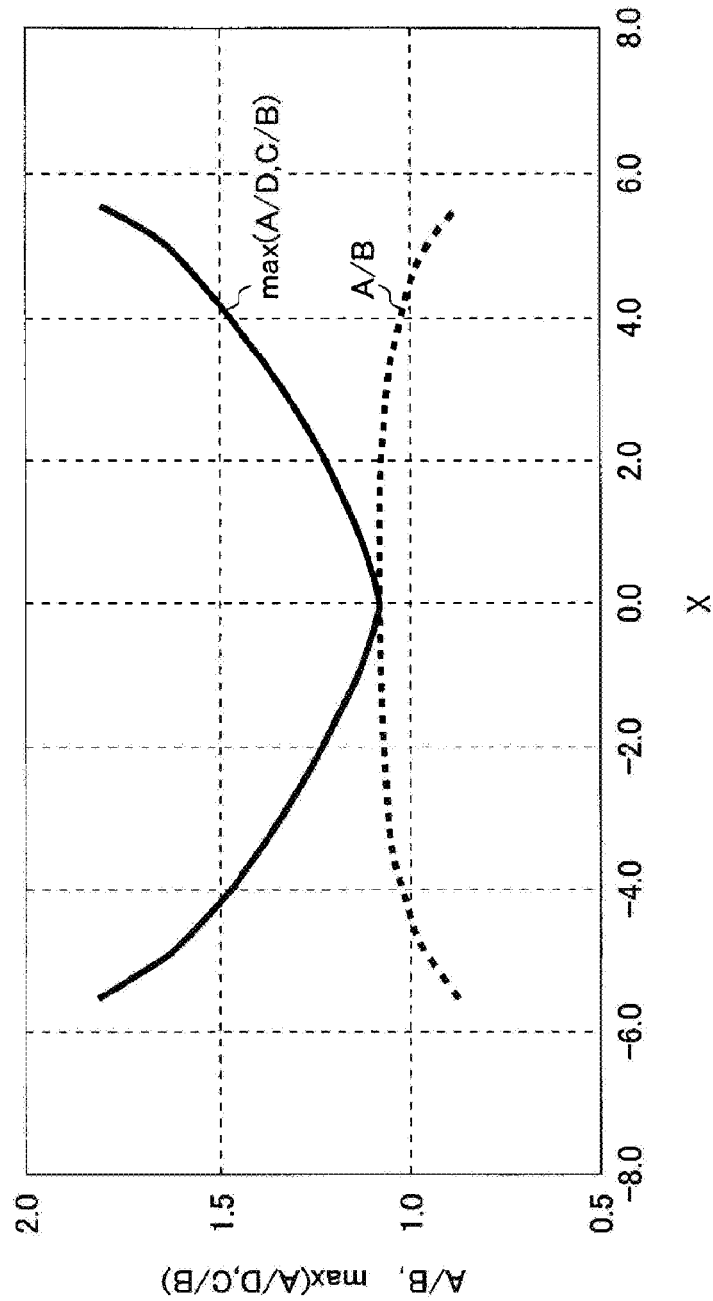
FIG. 13 is a view showing a correlation between X and A/B and a correlation between X and max (A/D, C/B).
Figure 14:
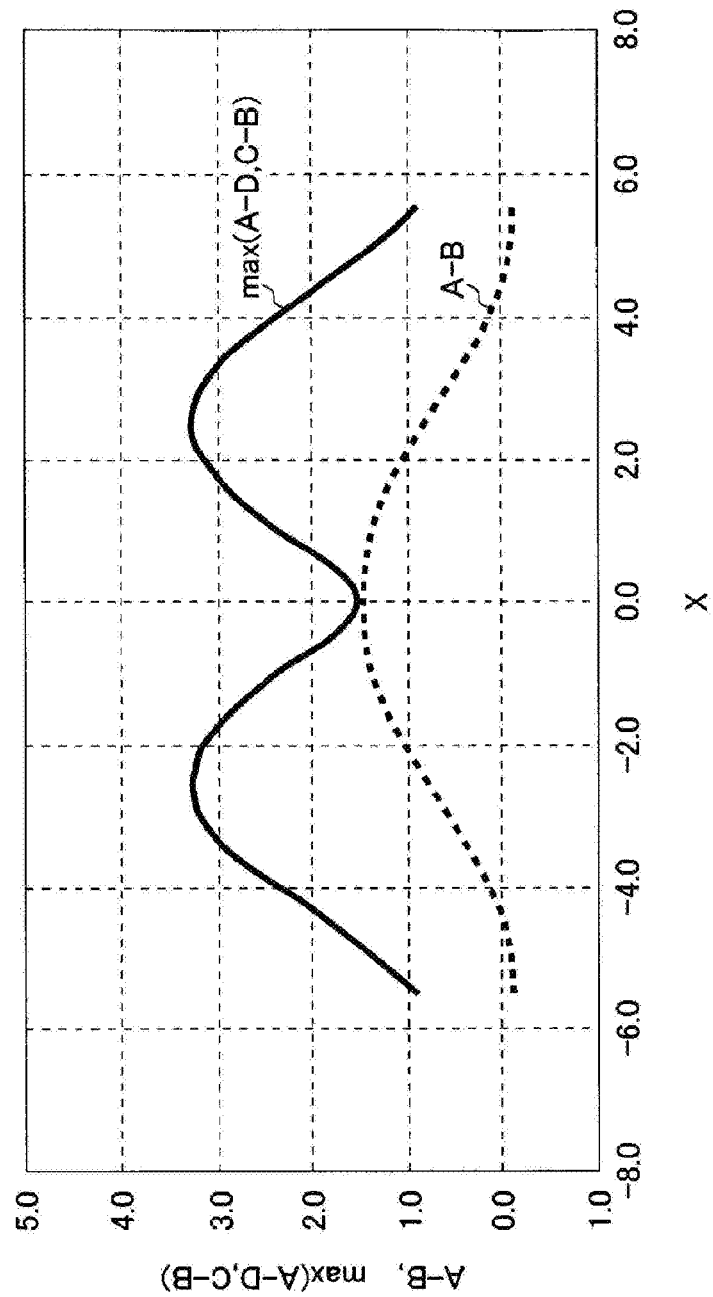
FIG. 14 is a view showing a correlation between X and A−B and a correlation between X and max (A−D, C−B).

FIG. 13 is a view showing a correlation between the displacement amount X of the magnetic sensor IC 40 and the magnetic field ratio A/B and a correlation between the displacement amount X of the magnetic sensor IC 40 and max (A/D, C/B). FIG. 14 is a view showing a correlation between the displacement amount X of the magnetic sensor IC 40 and the magnetic field difference A−B and a correlation between the displacement amount X of the magnetic sensor IC 40 and max (A−D, C−B).

The magnetic field ratio max (A/D, C/B) is the magnetic field ratio A/D or the magnetic field ratio C/B, whichever is larger. Similarly, the magnetic field difference max (A−D, C−B) is the magnetic field difference A−D or the magnetic field difference C−B, whichever is larger.

In addition, as preconditions of FIGS. 13 and 14, it is assumed that Y=0 mm, Z=5.0 mm, d=0.222 mm, and w=0.5 mm. Moreover, it is assumed that the magnet 50 is in the form of a thin plate having a length of 7.5 mm (in the left-right direction of the drawing sheet), a width of 7.5 mm (in the front-back direction of the drawing sheet) and a height of 0.5 mm (in the up-down direction of the drawing sheet). It is also assumed that the residual magnetic flux density of the magnet 50 is 1400 mT.

As indicated by a broken line in FIG. 13, the magnetic field ratio A/B becomes a maximum value (≈1.1) when X≈0, and decreases as |x| increases. On the other hand, as indicated by a solid line in FIG. 13, the magnetic field ratio max (A/D, C/B) becomes a minimum value (≈1.1) when X≈0 and increases as |X| increases. Therefore, the magnetic field ratio max (A/D, C/B) is always larger than the magnetic field ratio A/B without depending on the displacement amount X.

Further, as indicated by a broken line in FIG. 14, the magnetic field difference A−B becomes a maximum value (≈1.5) when X≈0, and decreases as |X| increases. On the other hand, as indicated by a solid line in FIG. 14, the magnetic field difference max (A−D, C−B) becomes a minimum value (≈1.5) when X≈0, and becomes a maximum value (≈3.2) when |X|≈2.5. When |X|>2.5, the magnetic field difference max (A−D, C−B) monotonously decreases. However, as shown in FIG. 14, at least when |X|<5.0, the magnetic field difference max (A−D, C−B) does not fall below the magnetic field difference A−B.

As can be seen from the above findings, when correctly determining the displacement states of the main body 10 and the cover 20, it can be said that it is more desirable to determine the positive/negative of the differential output between the magnetic sensors A and B (=A−D) or the differential output (=C−B) between the magnetic sensors B and C, whichever has a larger absolute value, than to compare the outputs of the magnetic sensors A and B.

<Fourth Embodiment>

Figure 15:
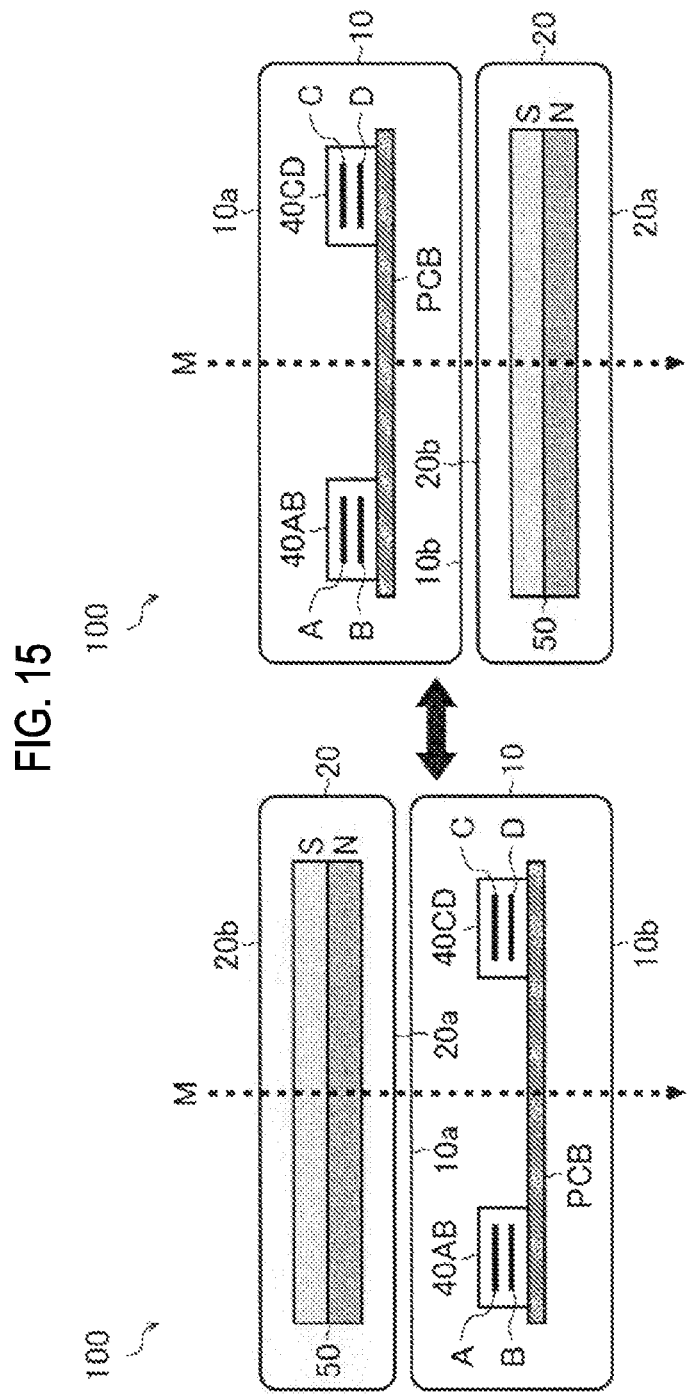
FIG. 15 is a schematic view showing a fourth embodiment of an electronic device.

FIG. 15 is a schematic view showing a fourth embodiment of the electronic device 100. The present embodiment is based on the third embodiment (see FIG. 7) described above and characterized in that the magnetic sensors A and B and the magnetic sensors C and D are dispersed and integrated in separate magnetic sensor ICs 40AB and 40CD. Therefore, the same constituent elements as those of the third embodiment are designated by the same reference numerals as in FIG. 7. Duplicate description thereof will be omitted. Hereinafter, the characterizing parts of the fourth embodiment will be mainly described.

As shown in FIG. 15, the magnetic sensor IC 40AB in which the magnetic sensors A and B are integrated is mounted on the first mounting surface of the printed circuit board PCB in the vicinity of the left end portion of the drawing sheet. In contrast, the magnetic sensor IC 40CD in which the magnetic sensors C and D are integrated is mounted on the first mounting surface of the printed circuit board PCB in the vicinity of the right end portion of the drawing sheet.

In other words, the magnetic sensor IC 40AB and the magnetic sensor IC 40CD are mounted on the same mounting surface of the printed circuit board PCB in the positions where the distance between them is as large as possible.

By adopting such a configuration, it is possible to widen the inter-sensor distance (the distance between the magnetic sensors A and B and the magnetic sensors C and D) as compared with the third embodiment (see FIG. 7) described above. Therefore, the output difference (=A−D) between the magnetic sensors A and D and the output difference (=C−B) between the magnetic sensors B and C becomes large. Therefore, even if the positional deviation of the cover 20 occurs, it is possible to correctly determine the displacement states of the main body 10 and the cover 20.

\<Other Modifications\>

In the above embodiments, the so-called 2-in-1 PC has been described as an application example. However, the application target of the present disclosure disclosed herein is not limited thereto. For example, the present disclosure may be used as a means for determining the open and closed states of a notebook type cover detachably attached to a smartphone or a tablet. Alternatively, the present disclosure may be suitably used as a means for determining the open and closed states of a clamshell type electronic device (a notebook PC, a portable game machine, etc.).

In addition to the above-described embodiments, various technical features disclosed herein may be modified in various ways without departing from the spirit of the technical creation thereof. In other words, it is to be understood that the above-described embodiments are exemplary and not limitative in all respects. The technical scope of the present disclosure is not defined by the description of the above-described embodiments but is defined by the claims. It should be understood that the technical scope of the present disclosure includes all modifications falling within the meaning and scope equivalent to the claims.

The present disclosure disclosed herein may be used for electronic devices such as, for example, a smartphone, a tablet and a notebook PC.

According to the present disclosure in some embodiments, it is possible to provide an electronic device capable of correctly determining the displacement states of a first housing and a second housing with a simple configuration.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electronic device, comprising:
a first housing and a second housing provided to be capable of being displaced between a first state in which first major surfaces thereof face each other and a second state in which second major surfaces thereof face each other;
a magnetic detection part provided in the first housing;
a magnet provided in the second housing; and
a control part configured to determine the first state and the second state based on an output of the magnetic detection part,
wherein the magnetic detection part includes a first magnetic sensor and a second magnetic sensor, and
wherein the first magnetic sensor, the second magnetic sensor, and the magnet overlap with each other as viewed in a direction orthogonal to the first major surface and the second major surface of the first housing.

2. The device of claim 1, wherein the control part is configured to determine the first state and the second state by comparing outputs of the first magnetic sensor and the second magnetic sensor.

3. The device of claim 1, wherein the first magnetic sensor and the second magnetic sensor are integrated in a single magnetic sensor IC.

4. The device of claim 3, wherein the magnetic sensor IC is mounted on a mounting surface of a printed circuit board.

5. The device of claim 4, wherein the first magnetic sensor and the second magnetic sensor are disposed between the magnet and the printed circuit board in the first state, and
wherein the printed circuit board is disposed between the first magnetic sensor and the second magnetic sensor, and the magnet in the second state.

6. The device of claim 1, wherein the first magnetic sensor is integrated in a first magnetic sensor IC and the second magnetic sensor is integrated in a second magnetic sensor IC, and
wherein the first magnetic sensor IC is mounted on a first mounting surface of a printed circuit board and the second magnetic sensor IC is mounted on a second mounting surface of the printed circuit board.

7. The device of claim 6, wherein the first magnetic sensor is disposed between the magnet and the printed circuit board in the first state, and
wherein the second magnetic sensor is disposed between the magnet and the printed circuit board in the second state.

8. The device of claim 1, wherein the magnetic detection part further includes a third magnetic sensor and a fourth magnetic sensor arranged along the direction orthogonal to the first major surface and the second major surface of the first housing, and
wherein the third magnetic sensor is disposed on the same plane as the first magnetic sensor and the fourth magnetic sensor is disposed on the same plane as the second magnetic sensor.

9. The device of claim 8, wherein the control part is configured to determine the first state and the second state by determining whether a differential output between the first magnetic sensor and the fourth magnetic sensor or a differential output between the second magnetic sensor and the third magnetic sensor, whichever has a larger absolute value, is positive or negative.

10. The device of claim 8, wherein the first magnetic sensor, the second magnetic sensor, the third magnetic sensor, and the fourth magnetic sensor are integrated in a single magnetic sensor IC.

11. The device of claim 8, wherein the first magnetic sensor and the second magnetic sensor are integrated in a first magnetic sensor IC and the third magnetic sensor and the fourth magnetic sensor are integrated in a second magnetic sensor IC, and
wherein the first magnetic sensor IC and the second magnetic sensor IC are mounted on the same mounting surface of a printed circuit board.

12. The device of claim 11, wherein the first magnetic sensor and the second magnetic sensor are disposed adjacent to one end of the mounting surface of the printed circuit board, and
wherein the third magnetic sensor and the fourth magnetic sensor are disposed adjacent to the other end of the mounting surface of the printed circuit board.

13. The device of claim 8, wherein the third magnetic sensor, the fourth magnetic sensor, and the magnet overlap with each other as viewed in the direction orthogonal to the first major surface and the second major surface of the first housing.

14. The device of claim 8, wherein the third magnetic sensor and the fourth magnetic sensor are disposed between the magnet and a printed circuit board in the first state, and wherein the printed circuit board is disposed between the third magnetic sensor and the fourth magnetic sensor, and the magnet in the second state.

15. The device of claim 1, further comprising:
a display part provided on the first major surface of the first housing; and
an operation part provided on the first major surface of the second housing,
wherein the control part is configured to put the electronic device in a pause state when the first state is determined and to put the operation part in an invalid state when the second state is determined.

16. The device of claim 1, wherein the first housing and the second housing are detachably attached to each other.

17. The device of claim 1, wherein each of the first magnetic sensor and the second magnetic sensor is arranged to detect a magnetic field applied perpendicularly to the first major surface and the second major surface of the first housing.

18. The device of claim 1, wherein the magnet is disposed such that a magnetization direction thereof is orthogonal to the first major surface and the second major surface of the second housing.

19. The device of claim 1, wherein the first magnetic sensor and the second magnetic sensor are arranged such that a detection direction thereof is orthogonal to the first major surface and the second major surface of the first housing.

20. The device of claim 1, wherein the magnet includes a first surface and a second surface, and
wherein the first surface and the second surface are parallel to the first major surface and the second major surface of the second housing.

21. The device of claim 1, wherein a virtual line connecting the first magnetic sensor and the second magnetic sensor is orthogonal to the first major surface and the second major surface of the first housing.

* * * * *